(12) United States Patent
Jeffers

(10) Patent No.: US 11,122,706 B2
(45) Date of Patent: Sep. 14, 2021

(54) HEAT TRANSFER APPARATUS

(71) Applicant: Nokia Technologies Oy, Espoo (FI)

(72) Inventor: Nicholas Jeffers, Wicklow (IE)

(73) Assignee: Nokia Technologies Oy, Espoo (FI)

( * ) Notice: Subject to any disclaimer, the term of this patent is extended or adjusted under 35 U.S.C. 154(b) by 94 days.

(21) Appl. No.: 16/441,730

(22) Filed: Jun. 14, 2019

(65) Prior Publication Data
US 2019/0387643 A1 Dec. 19, 2019

(30) Foreign Application Priority Data

Jun. 19, 2018 (EP) ..................... 18178392

(51) Int. Cl.
*H05K 7/20* (2006.01)
*F28D 15/04* (2006.01)

(52) U.S. Cl.
CPC ......... *H05K 7/20327* (2013.01); *F28D 15/04* (2013.01); *H05K 7/20309* (2013.01); *H05K 7/20318* (2013.01)

(58) Field of Classification Search
CPC ........... H05K 7/20327; H05K 7/20309; H05K 7/20318; F28D 15/04; F28D 15/043; F28D 15/0233; F28D 15/046; F28D 15/0266; F28F 3/08; F28F 3/086; F28F 3/12; G06F 1/203; H01L 23/427
See application file for complete search history.

(56) References Cited

U.S. PATENT DOCUMENTS

| 6,410,982 B1 * | 6/2002 | Brownell | F28D 15/0266 257/713 |
| 8,780,560 B2 * | 7/2014 | Ogata | F28D 15/046 361/700 |
| 2002/0056908 A1 * | 5/2002 | Brownell | H05K 1/0209 257/714 |
| 2005/0274496 A1 | 12/2005 | Ishii et al. | |

(Continued)

FOREIGN PATENT DOCUMENTS

| EP | 3279597 A1 | 2/2018 |
| WO | 2017/072493 A1 | 5/2017 |

OTHER PUBLICATIONS

Wu et al., "Manufacturing of Complex Bi-Porous Wick and Applying to a Loop Heat Pipe", 5th International Microsystems Packaging Assembly and Circuits Technology Conference, Oct. 20-22, 2010, 4 pages.

(Continued)

*Primary Examiner* — Gordon A Jones
(74) *Attorney, Agent, or Firm* — Harrington & Smith

(57) ABSTRACT

A heat transfer apparatus and method of manufacture is disclosed. The manifold may have a first mechanical interface, a second mechanical interface remote from the first mechanical interface and one or more internal walls defining at least first and second channels within the manifold between the first and second mechanical interfaces. An evaporator member may be attached to the manifold so as to seal the first mechanical interface. A condenser member may be attached to the manifold so as to seal the second mechanical interface. The manifold, evaporator and condenser members may provide a contained heat transfer system in which a working fluid moves between the condenser member and the evaporator member.

15 Claims, 5 Drawing Sheets

(56) References Cited

U.S. PATENT DOCUMENTS

| | | | |
|---|---|---|---|
| 2012/0255708 A1* | 10/2012 | Wu | F28D 15/0266 |
| | | | 165/67 |
| 2015/0237762 A1 | 8/2015 | Holt et al. | |
| 2016/0095254 A1 | 3/2016 | Mann et al. | |
| 2017/0047625 A1 | 2/2017 | Bhunia et al. | |
| 2017/0343299 A1 | 11/2017 | Huang et al. | |

OTHER PUBLICATIONS

Muthu et al., "Embedded Thermal Management Solution for Power Electronics PCB Using Additive Manufacturing", Asian Conference on Energy, Power and Transportation Electrification (ACEPT), Oct. 24-26, 2017, 6 pages.

Extended European Search Report received for corresponding European Patent Application No. 18178392.9, dated Dec. 14, 2018, 6 pages.

* cited by examiner

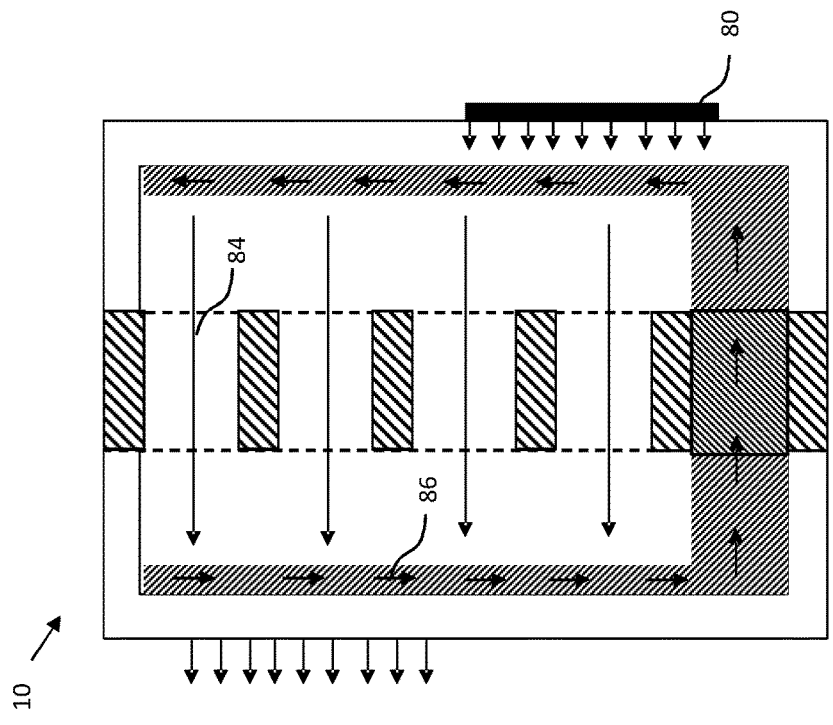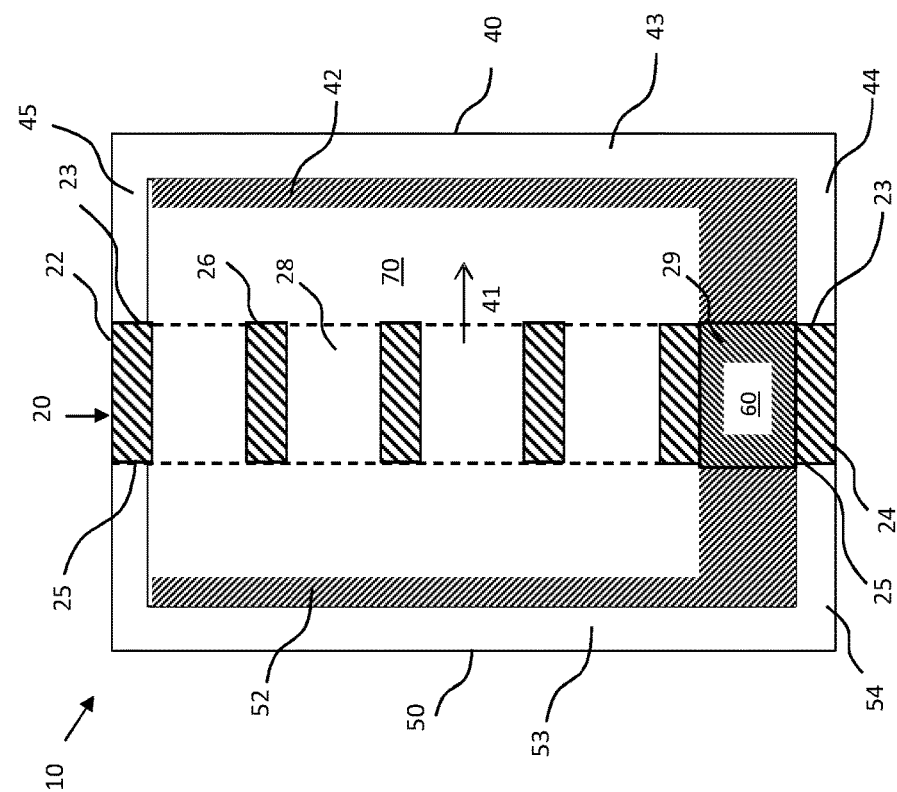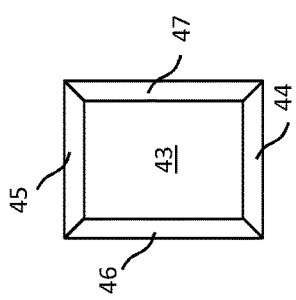

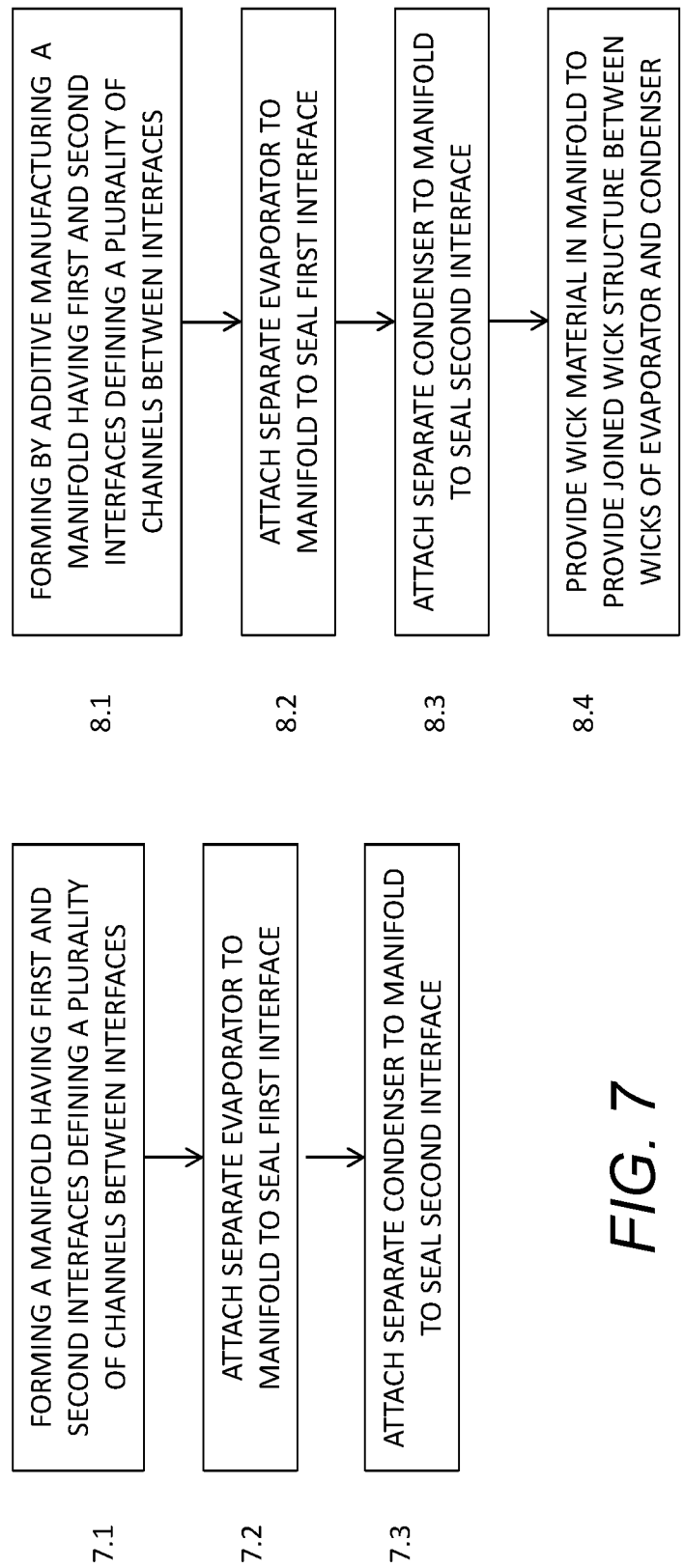

HEAT TRANSFER APPARATUS

FIELD

Example embodiments relate to a heat transfer apparatus and also to a method for forming a heat transfer apparatus.

BACKGROUND

A heat transfer apparatus is used to transfer heat between two solid interfaces. A common form of heat transfer apparatus is the heat pipe. A heat pipe is a contained system that receives heat from an external source at an evaporator portion. The external source may, for example, be an electrical or electronic component. The heat conducts across the wall of the evaporator portion and usually through a thermally-conductive wick structure holding a working fluid in liquid form. The applied heat causes a phase change of the working fluid to vapour. This causes a sharp increase in pressure. The rising vapour moves to another part of the heat pipe at a condenser portion, where it cools. This cooling causes a sharp decrease in pressure, and the pressure differential results in fast transport of heat from the evaporator portion to the condenser portion. Heat is removed to the outside environment. At the condenser portion, the fluid changes phase again and condenses on the walls of the wick which pulls the fluid by capillary action to the evaporator portion again.

SUMMARY

According to one embodiment, there is provided an apparatus, comprising: means for evaporating a working fluid responsive to applied heat; means for condensing evaporated working fluid; and means for connecting the evaporating and condensing means, the connecting means comprising a manifold having a first mechanical interface, a second mechanical interface remote from the first mechanical interface and one or more internal walls defining at least first and second channels within the manifold between the first and second mechanical interfaces, wherein the evaporating means is coupled to the manifold so as to seal the first mechanical interface, the condensing means is coupled to the manifold so as to seal the second mechanical interface, and wherein the manifold, evaporating means and condensing means provide a contained heat transfer system in which a working fluid moves between the condenser member and the evaporator member.

A first wicking means may be provided in the first channel of the manifold, the evaporating means being coupled to a second wicking means, and the condensing means may coupled to a third wicking means, wherein the first wicking means may locate between the second and third wicking means to provide a joined wicking structure for moving working fluid between the second and third wicking means, via the first wicking means, by capillary action.

The first wicking means may comprise a powdered material.

One or both of the second and third wicking means may be grooves or fibres formed on the evaporating and/or condensing means.

The manifold may comprise one or more internal walls defining bifurcated second channels between the evaporating and the condensing means, the bifurcated second channels extending between different respective parts of the second and/or the third wicking means.

The manifold may comprise a plurality of first mechanical interfaces, wherein a plurality of evaporating means are coupled to the manifold so as to seal respective ones of the first mechanical interfaces, each evaporating means having a respective third wicking means, and wherein the one or more internal walls of the manifold define one or more second channels between the plural evaporating means and the condensing means.

The manifold may be formed by additive manufacturing. The manifold may be formed by three-dimensional printing, for example.

The apparatus may comprise a plurality of such manifolds mechanically connected in a three-dimensional structure, wherein a first evaporating or condensing means is mounted on a first such manifold in such a way as to seal, respectively, a first or second mechanical interface of another such manifold when the two are mechanically connected.

The or each evaporating means may be associated with an electrical or electronic component. The or each electrical or electronic component may be supported by at least part of the manifold.

The manifold may comprise a thermally-insulative material.

According to another embodiment, there is provided a method, comprising: forming a manifold having a first mechanical interface, a second mechanical interface remote from the first mechanical interface and one or more internal walls defining at least first and second channels within the manifold between the first and second mechanical interfaces; coupling an evaporating means to the manifold so as to seal the first mechanical interface; and coupling a condensing means to the manifold so as to seal the second mechanical interface, wherein the manifold, evaporating and condensing means provide a contained heat transfer system in which a working fluid moves between the condensing means and the evaporating means.

The method may further comprise providing a first wicking means in the first channel of the manifold, the evaporating and condensing means having respective second and third wicking means coupled thereto, to provide an enclosed heat transfer system in which the first wicking means locates between the second and third wicking means to provide a joined wicking structure for moving working fluid between the interfaces, via the first wicking means, by capillary action.

The manifold may be formed by an additive manufacturing process.

According to another embodiment, there is provided an apparatus, comprising: a manifold having a first mechanical interface, a second mechanical interface remote from the first mechanical interface and one or more internal walls defining at least first and second channels within the manifold between the first and second mechanical interfaces; an evaporator member attached to the manifold so as to seal the first mechanical interface; and a condenser member attached to the manifold so as to seal the second mechanical interface, wherein the manifold, evaporator and condenser members provide a contained heat transfer system in which a working fluid moves between the condenser member and the evaporator member.

A first wick may be provided in the first channel of the manifold, the evaporator member may be coupled to a second wick, and the condenser member may be coupled to a third wick, wherein the first wick locates between the second and third wicks to provide a joined wick structure for moving working fluid between the second and third wicks, via the first wick, by capillary action. The first wick may comprise a powdered material. One or both of the second and third wicks may comprise grooves or fibres formed on the evaporator and/or condenser members. The manifold may comprise one or more internal walls defining bifurcated second channels between the evaporator and the condenser member, the bifurcated second channels extending between different respective parts of the second and/or the third wicks. The manifold may comprise a plurality of first mechanical interfaces, wherein a plurality of evaporator members are attached to the manifold so as to seal respective ones of the first mechanical interfaces, each evaporator member having a respective third wick, and wherein the one or more internal walls of the manifold define one or more second channels between the plural evaporators and the condenser member.

The manifold may be formed by additive manufacturing. The manifold may be formed by three-dimensional printing.

The apparatus may further comprise comprising a plurality of such manifolds mechanically connected in a three-dimensional structure, wherein a first evaporator member is mounted on a first such manifold in such a way as to seal, respectively, a first or second mechanical interface of another such manifold when the two are mechanically connected.

The apparatus may further comprise a plurality of such manifolds mechanically connected in a three-dimensional structure, wherein a first condenser member is mounted on a first such manifold in such a way as to seal, respectively, a first or second mechanical interface of another such manifold when the two are mechanically connected.

The or each evaporator member may be associated with an electrical or electronic component. The or each electrical or electronic component may be supported by at least part of the manifold.

The manifold may comprise a thermally-insulative material.

According to another embodiment, there is provided a method, comprising: forming a manifold having a first mechanical interface, a second mechanical interface remote from the first mechanical interface and one or more internal walls defining at least first and second channels within the manifold between the first and second mechanical interfaces; attaching an evaporator member to the manifold so as to seal the first mechanical interface; and attaching a condenser member to the manifold so as to seal the second mechanical interface, wherein the manifold, evaporator and condenser members provide a contained heat transfer system in which a working fluid moves between the condenser member and the evaporator member.

The method may further comprise providing a first wick material in the first channel of the manifold, the evaporator and condenser members having respective second and third wicks coupled thereto, to provide an enclosed heat transfer system in which the first wick locates between the second and third wicks to provide a joined wick structure for moving working fluid between the interfaces, via the first wick, by capillary action.

The manifold may formed by an additive manufacturing process. The manifold may be formed by three-dimensional printing.

The method may further comprise mounting one or more electrical or electronic components to the evaporator member. The method may further comprise mounting the one or more electrical or electronic components to the evaporator by means of the manifold. The manifold may comprise a thermally-insulative material.

BRIEF DESCRIPTION OF DRAWINGS

Example embodiments will now be described, by way of non-limiting example, with reference to the accompanying drawings, in which:

FIG. 1A is a cross-sectional view of a heat pipe apparatus according to an example embodiment;

FIG. 1B is a plan view of one part of the FIG. 1A heat pipe apparatus;

FIG. 2 is a cross-sectional view of the FIG. 1 heat-pipe apparatus, indicating operation with a heat source mounted thereon;

FIG. 7 is a flow diagram showing operations in a method of manufacture of a heat pipe apparatus according to example embodiments; and FIG. 8 is a flow diagram showing operation in a method of manufacture of a heat pipe apparatus according to another example embodiment.

DETAILED DESCRIPTION

Figure 3:
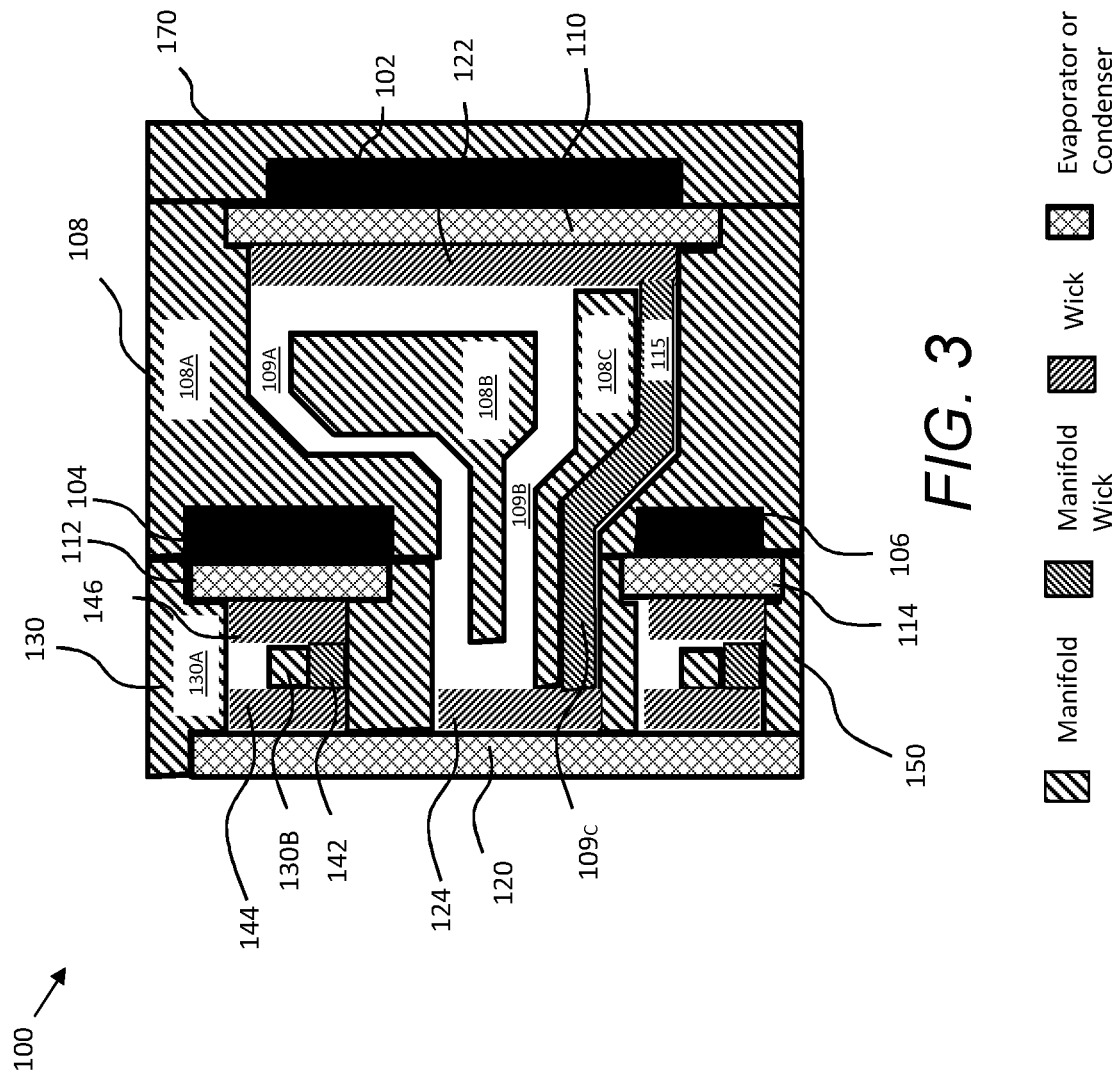
FIG. 3 is a cross-sectional view of a heat pipe apparatus according to another example embodiment.

Example embodiments relate generally to heat transfer apparatuses, sometimes called heat exchangers. As explained previously, an example form of heat transfer apparatus is a heat pipe which is used to transfer heat between two solid interfaces by means of promoting phase change of a working fluid, e.g. by evaporation from liquid to vapour and then condensation from vapour to liquid. Heat pipes are used in various applications, one of which is the removal of excess or unwanted heat from electrical or electronic components which may otherwise cause damage to, or a drop in performance of, the component or components. Heat pipes are generally located adjacent a heat sink associated with the one or more components mounted on a planar circuit board.

Embodiments herein relate to heat pipes for removing unwanted heat from electrical or electronic components, but the applications of said embodiments are not limited to such.

Example embodiments relate to what may be termed a deconstructed form of heat pipe, that is a heat pipe in which mechanically separate evaporator and condenser members are provided, and are then mechanically attached during manufacture to a manifold which completes an enclosed internal chamber in which the phase changes of a working fluid occurs in use. More than one manifold may be used to complete the enclosed internal chamber. The manifold may comprise one or more walls to define channels within the enclosed internal chamber which form part of a circuit around which the working fluid moves in use.

The manifold may be of any shape and size based on requirements. The manifold may be formed by additive manufacturing (AM), which is a process by which three-dimensional objects are formed layer-upon-layer by depositing material. The material used may be of any suitable type, and additive manufacturing can involve plastics and metals. Three-dimensional printing is a known type of additive manufacturing, in which material is joined or solidified under computer control to create a three-dimensional object. An advantage with additive manufacturing (AM) is the flexibility to create objects of almost any shape or geometry, and the ability to achieve relatively high accuracy. Where thermally insulating materials (i.e. materials with a high thermal resistance) the manifold may act as an insulator in harsh environments or conditions. For example, in cold environments, electronics may be prevented from failure because phase change in the manifold does not occur. Without phase change the electronic component is essentially thermally decoupled from the outside, however, the manifold itself can transfer heat via conduction but this can be mitigated if the manifold is made from an insulating material (<1 W/mK).

FIG. 1A shows a heat pipe 10 in cross-section, according to an example embodiment. The heat pipe 10 comprises a ladder-type manifold 20 having an upper wall 22, a lower wall 24 and one or more internal walls 26 which are spaced apart from the upper and lower walls 22, 24 to define channels 28. One of said channels 29, namely that between the lower wall 24 and an above internal wall 26 houses a wick 60, hereafter referred to as the manifold wick. Said channel 29 may hereafter be referred to as a wick channel.

A wick in the context of heat pipes generally is a material or structure that moves working fluid in liquid form by means of capillary action. A wick may comprise a material having pores or grooves suitable for moving the liquid in a given direction. Example constructions include homogeneous or composite constructions, and examples of the former include wrapped screen wicks, sintered metal particles, powder or fibres, grooves and arteries, whereas examples of the latter include composite screens, screen covered grooves and spiral arteries.

Example embodiments use non-conducting powder for the manifold wick 60. The powder may be packed, which may involve the powder being loosely packed.

Opposed end faces of the upper and lower walls 22, 24 define first and second mechanical interfaces 23, 25. The first and second mechanical interfaces 23, 25 are in use connected to, or covered by, separate evaporator and condenser members 40, 50 respectively.

The evaporator member 40 comprises a generally tray-shaped wall member which is a generally U-shaped in cross-section as shown. Other cross-sections may be used. The wall member may be formed of metal material or one or more other thermally conducting materials. The wall member shown may therefore comprise five walls as will be appreciated. Referring to FIG. 1B, which is a plan view of the evaporator member 40 in the direction indicated by the arrow 41, these five walls may comprise a major wall 43, a lower wall 44, an upper wall 45 and two side walls 46, 47. The major wall 43 and the lower wall 44 will be referred to in the following. Referring back to FIG. 1A, within the wall member is provided an associated wick, hereafter referred to as the second wick or evaporator wick 42, which may comprise any one of the above wick types other than loose powder. The evaporator wick 42 is adjacent most or all of the major wall 43 and most or all of that of the lower wall 44, up to the terminating end face of the lower wall.

The condenser member 50 is similarly constructed, comprising a generally tray-shaped wall member which is a generally U-shaped in cross-section as shown. Other cross-sections may be used. The wall member may be formed of metal material or one or more other thermally conducting materials. The wall member shown may therefore comprise five walls as will be appreciated, similar in form to the plan view of FIG. 1B. A major wall 53 and a lower wall 54 will be referred to in the following. Within the wall member is provided an associated wick, hereafter referred to as the third wick or condenser wick 52, which may comprise any one of the above wick types other than loose powder. The condenser wick 52 is adjacent most or all of the major wall 53 and most or all of that of the lower wall 54, up to the terminating end face of the lower wall.

In other embodiments, the evaporator member 40 and/or the condenser member 50 may have different shapes. For example, the part of the evaporator member 40 that carries the heat source 80 may be formed of thermally conductive material, the part of the condenser member 50 where heat is being removed may comprise thermally conductive material, and otherwise the remaining parts may be replaced with other non-thermally conductive material. Therefore, in other embodiments, the evaporator and condenser members 40, 50 may comprise the respective major walls 43, 53 and the remaining walls may comprise part of the manifold 20.

The evaporator and condenser members 40, 50 may be formed also by additive manufacturing, e.g. three-dimensional printing.

The arrangement of the manifold first and second mechanical interfaces 23, 25, and corresponding end-wall interfaces of the evaporator and condenser members 40, 50 is such that, when connected together, a contained space 70 is defined with a plurality of internal channels 28, including the wick channel 29. Also, when connected, the manifold wick 60 locates in-between, and in contact with, the evaporator and condenser wicks 42, 52 to form a joined wick as shown in FIG. 1. A working fluid eg water (not shown) is also provided in the contained space 70 and space 70 is under vacuum and free from any non-condensable gases.

FIG. 2 shows the heat pipe 10 in operation. Corresponding reference numerals apply where appropriate. A source 80 of heat, which may be an electrical or electronic component, a printed circuit board (PCB) or printed wire board (PWB) carrying one or more such components, or a heat sink associated with one or more such components, is shown adjacent the major wall 43 of the evaporator member 40. The heat source 80 can be any component that generates heat, including motors, turbines etc. The heat source 80 may be carried on, mounted on or even buried in, the major wall 43.

Heat enters the heat pipe 10 into the evaporator member 40 and causes the working fluid to evaporate, causing the condensing wick to pull fluid in where evaporation has occurred via capillary action. The resulting vapour 84 passes through one or more of the channels 28 defined by the one or more manifold internal walls 26, as indicated by the arrows 84. The vapour cools as it crosses into the condenser member 50 and heat is carried away into the outside environment. The vapour condenses into liquid at or in the condenser wick 52, whereafter the capillary action of said wick moves the liquid down 86 and across the manifold wick 60 to the evaporator wick 42 whereafter the cycle repeats as further heat enters from the source 80.

The structure of the FIGS. 1 and 2 embodiment demonstrates the principle of joining decoupled evaporator and condenser members 40, 50 with a manifold 20 which it will be appreciated can enable a wide range of heat pipe three-dimensional structures and shapes to be formed, e.g. using additive manufacturing. Other example embodiments will now be described, using more complex structures. However, the same principles of operation may apply.

FIG. 3 shows another example embodiment heat pipe apparatus 100 for removing unwanted heat from multiple, in this case first, second and third heat sources 102, 104, 106. The heat sources 102, 104, 106 may be electrical or electronic components, printed circuit boards (PCBs) or printed wire boards (PWBs) carrying one or more such components, or heat sinks associated with one or more such components or other heat generating source. The heat sources 102, 104, 106 are in this case buried within a more complex three-dimensional manifold arrangement, which is both feasible and useful if the manifold is formed using additive manufacturing or certain other conventional manufacturing methods such as injection moulding, casting, computer numerical control (CNS) machining etc. For example, it enables the heat pipe apparatus 100 to be mechanically robust and also to occupy a relatively smaller volume because it allows stacking of the heat generating components 102, 104, 106, with separate heat pipes associated with each.

The manifold arrangement comprises a first manifold 108 comprised of an outer part 108A and two inner walls 108B, 108C which defines a first chamber divided into three channels 109A, 109B, 109C between a first evaporator member 110, located alongside the first heat source 102, and a separately formed condenser member 120 located to the other side of the heat pipe apparatus 100. The third channel 109C comprises a manifold wick 115, which may be sintered or not sintered powder as for the FIG. 1 embodiment. The manifold wick 115 is in contact at either end with an evaporator wick 122 at one part thereof and with a condenser wick 124 at another part thereof to provide an overall joined wick structure through which a working fluid of the first chamber may circulate and change phase in the manner already described.

The provision of multiple channels 109A, 109B, 109C is useful to prevent bottlenecks occurring in vapour flow. For example, the heat source 102 may be a PCB or PWB carrying multiple components and therefore producing hotspots. The arrangement of the multiple channels 109A, 109B, 109C allows for this and aims to prevent vapour flow chocking.

The manifold arrangement further comprises a second manifold 130 comprised of an outer part 130A and an inner wall 130B, which defines a second chamber divided into two channels between a second evaporator member 112, located alongside the second head source 104, and the condenser member 120. The second channel comprises another manifold wick 142 which may be sintered powder. The manifold wick 142 is in contact at either end with an evaporator wick 144 at one part thereof and another condenser wick 146 at another part thereof to provide an overall wick structure through which a working fluid of the second chamber may circulate.

The manifold arrangement further comprises a third manifold 150 comprised in a similar fashion to the second manifold 130, having an outer part and an inner wall which defines a third chamber divided into two channels between a third evaporator member 114, located alongside the third head source 106 and the separate condenser member 120. The second channel comprises another manifold wick which may be sintered powder. The manifold wick is in contact at either end with an evaporator wick at one part thereof and another condenser wick at another part thereof to provide an overall wick structure through which a working fluid of the third chamber may circulate.

A fourth manifold 170 may be provided to enclose the first heat source 102 as shown.

In this manifold arrangement example, the manifolds 108, 130, and 150 are coupled to a common condenser member 120. It will be appreciated that the condenser member 120 may comprise multiple separate condenser members. For example, all manifolds 108, 130, 150 may be coupled to their own separate condenser members, or some of the manifolds may be coupled to a common condenser member and some manifolds may be coupled to their own condenser member, or a combination of thereof.

It will be appreciated from the FIG. 3 example embodiment that we may be able to build customised and complex three-dimensional heat pipes without compromising thermal performance Printed circuit boards or printed wire boards may be stacked into any mechanical shape and move heat to the outside environment with low thermal resistance. The volume of products may have any shape. This may be significant because of the trend to using, for example in radio frequency (RF) communications, increased cell densities and short transmission lengths of next-generation mm-wave transceivers (which may be very close to end-users).

Figure 4:
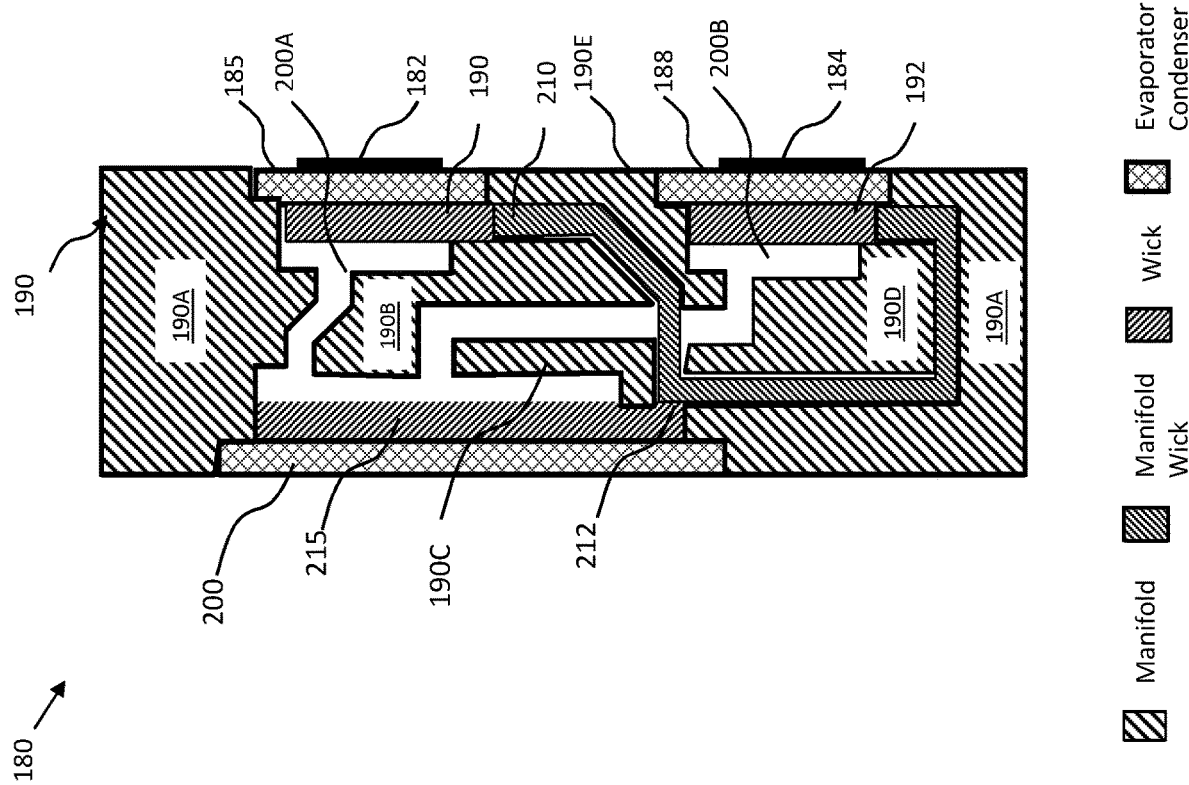
FIG. 4 is a cross-sectional view of a heat pipe apparatus according to another example embodiment.

FIG. 4 shows another example embodiment heat pipe apparatus 180 for removing unwanted heat from multiple, in this case first and second, heat sources 182, 184. Bifurcates channels are employed in this embodiment. The heat sources 182, 184 may be electrical or electronic components, printed circuit boards (PCBs) or printed wire boards (PWBs) carrying one or more such components, or heat sinks associated with one or more such components. The heat sources 182, 184 are in this case carried externally to the side of a complex three-dimensional manifold arrangement, which is both feasible and useful if the manifold is formed using additive manufacturing.

In the FIG. 4 heat pipe apparatus 180, the first and second heat sources 182, 184 are associated with first and second adjacent evaporator members 185, 188. The manifold arrangement comprises a manifold 190 comprised of an outer part 190A, and inner walls 190B, 190C, 190D, 190E which define a chamber divided into multiple channels. The first evaporator member 185, located alongside the first heat source 182, is associated with the first channel 200A. The second evaporator member 188 is associated with the second channel 200B. First and second evaporator wicks 190, 192 are located alongside both the first and second evaporator members 185, 188. A separately formed condenser member 200 is located to the other side of the heat pipe apparatus 180. A third channel is shown filled with a manifold wick 210, which may or may not be sintered powder as for the FIG. 1 embodiment. The manifold wick 210 in this case is in contact at either end with the first and second evaporator wicks 190, 192 and an intermediate point 212 thereof is in contact with a condenser wick 215. Therefore, in a similar style of operation as previous examples, working fluid is able to move from the condenser wick 215 through the resulting joined wick structure to the manifold wick 210 to the first and second evaporator wicks 190, 192 so that the working fluid may circulate and change phase in the manner already described. The manifold wick 210 may or may not be sintered powder as for the FIG. 1 embodiment.

Figures 5, 6:
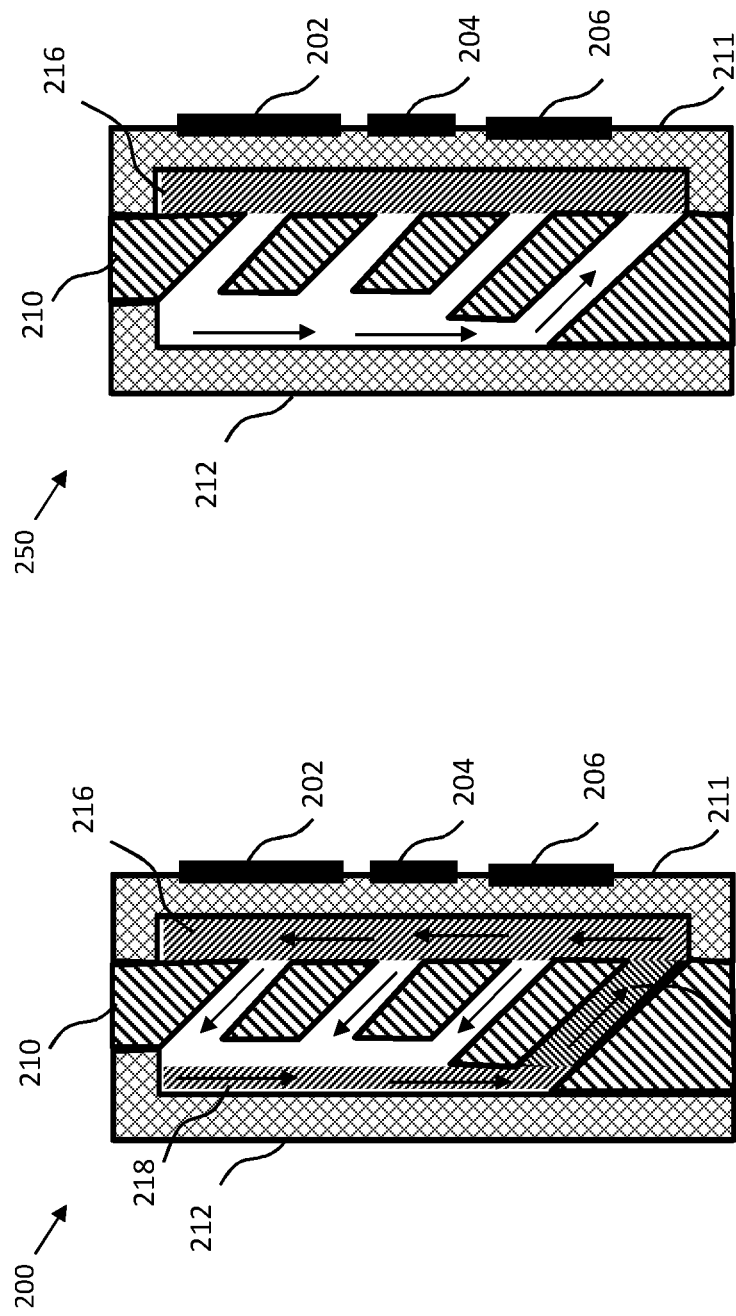
FIG. 5 is a cross-sectional view of a heat pipe apparatus according to another example embodiment.
FIG. 6 is a cross-sectional view of a heat pipe apparatus according to another example embodiment.

FIG. 5 shows another example embodiment heat pipe apparatus 200 for removing unwanted heat from multiple, in this case first, second and third heat sources 202, 204, 206. The heat sources 202, 204, 206 may be electrical or electronic components, printed circuit boards (PCBs) or printed wire boards (PWBs) carrying one or more such components, or heat sinks associated with one or more such components. Other examples of heat sources have been mentioned previously, and embodiments herein are not limited to such. The heat sources 202, 204, 206 are in this case carried externally to the side of a three-dimensional manifold arrangement, which may be both feasible and useful if the manifold is formed using additive manufacturing.

The heat pipe apparatus 200 may be useful for environments where there are large variations in environmental extremes, e.g. between day and night. For example, in an arid environment, it may be beneficial electronics being cooled during the day and insulated from cold at night. The shown heat pipe apparatus 200 may have a very low thermal resistance when component temperatures are above the phase change temperature of the fluid, e.g. above 40 degrees Celsius. If the component temperature drops below this temperature, then phase change no longer happens and the heat pipe apparatus 200 has a very high conductive thermal resistance. In other words, the heat pipe may act as a thermal insulator for the electronics, protecting the electronics from electrical failures due to extreme cold. This may make the heat pipe apparatus 200 useful for scenarios where protection against thermal shock is desired, e.g. in space or on the moon.

The heat pipe apparatus 200 comprises a manifold 210 which may be formed using additive manufacturing similar to the previous examples. The manifold 210 comprises an upper and lower wall and three internal walls, defining four channels. At the interfaces of the manifold 210 are fixed an evaporator member 211 and a condenser member 212, each having an associated wick 216, 218. The lower channel of the manifold 120 houses a manifold wick 214 in contact with the evaporator and condenser wicks 216, 218 to provide a joined manifold structure so that working fluid may circulate and change phase in the manner already described, and as indicated by the arrows. The manifold wick 214 may be sintered powder as for the FIG. 1 embodiment.

FIG. 6 is another example embodiment heat pipe apparatus 250, similar in structure to the FIG. 5 example, but which employs a hybrid design of heat pipe and gravity driven thermosiphon. Corresponding reference numerals apply where appropriate. In this configuration, the condensed working fluid is returned to the evaporator member 211 via gravity and not capillary action. When phase change no longer occurs at low component temperatures, there is a higher thermal resistance between the evaporator member 211 and the condenser member 212 than the embodiment shown in FIG. 5. The wick 216 is coupled to the evaporator member 211.

Here, as with the other embodiments, there is no convection in a heat pipe apparatus 250 because it is an evacuated chamber. Radiative heat transfer between the evaporator member 211 and the condenser member 212 is reduced by the fact that there is no transverse line of sight between the two. Therefore, conduction is the major heat transfer mechanism coupling the two together. If the manifold 210 is made out of an insulating material, then the evaporator member 211 and the condenser member 212 are thermally decoupled. This may also work for electrical isolation of electrical or electronic components from the outer enclosure which could be of advantage.

A suitable material for the manifold 210 may comprise a plastics material or similar. For example, the manifold 210 may be a plastics material. For example, the manifold 210 may have a thermal conductivity of less than 1 W/mK. For example, the evaporator and condenser members 211, 212 may comprise a more thermally conductive material with a thermal conductivity greater than 1 W/mK. For these evaporator and condenser members 211, 212, copper is a possible material to use, having a thermal conductivity of 400 W/mK. Alternatively, thermally conductive plastics are available with thermal conductivities of approximately 20 W/mK that may be suitable, for example, if thin-walled.

As mentioned previously, embodiments comprise various parts that can be manufactured in the shown and described forms, which are given merely by way of example, using additive manufacturing.

FIG. 7 is a flow diagram showing operations that may comprise a method of manufacture. A first operation 7.1 may comprise forming a manifold having first and second interfaces defining a plurality of channels between the interfaces. Another operation 7.2 may comprise attaching a separate evaporator to the manifold to seal the first interface. Another operation 7.3 may comprise attaching a separate condenser to the manifold to seal the second interface.

FIG. 8 is a flow diagram showing operations that may comprise another method of manufacture. A first operation 8.1 may comprise forming by additive manufacturing, e.g. three-dimensional printing, a manifold having first and second interfaces defining a plurality of channels between interfaces. Another operation 8.2 may comprise attaching a separate evaporator to the manifold to seal the first interface. Another operation 8.3 may comprise attaching a separate condenser to the manifold to seal the second interface. Another operation 8.4 may comprise providing a wick material in the manifold to provide a joined wick structure between wicks of the evaporator and condenser.

The attachment or coupling of the evaporator and condenser members to the manifold may be by means of an adhesive that also provides sealing or mechanically with a separate gasket for sealing and fixing screws The evaporator and condenser members may also be formed by additive manufacturing.

The manifold may be formed of a thermally-insulative material, so as to thermally decouple the evaporator and condenser members in the absence of phase change of the working fluid.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The invention claimed is:

1. An apparatus comprising:
 a manifold having: a first mechanical interface, a second mechanical interface remote from the first mechanical interface, and one or more internal walls defining at least a first channel and a second channel within the manifold between the first and second mechanical interfaces;
 an evaporator member attached to the manifold and configured to seal the first mechanical interface; and
 a condenser member attached to the manifold and configured to seal the second mechanical interface;
 wherein the manifold, the evaporator member, and the condenser member provide a contained heat transfer system configured to allow a working fluid to move between the condenser member and the evaporator member;
 wherein the manifold comprises a thermally-insulative material connecting the evaporator member and the condenser member.

2. The apparatus of claim 1 further comprising: a first wick provided in the first channel of the manifold, the evaporator member coupled to a second wick, and the condenser member coupled to a third wick, wherein the first wick locates between the second and third wicks to provide a joined wick structure for moving working fluid between the second and third wicks, via the first wick, by capillary action.

3. The apparatus of claim 2, wherein the first wick comprises a powdered material.

4. The apparatus of claim 2, wherein one or both of the second and third wicks comprise grooves or fibres formed on the evaporator member and/or the condenser member.

5. The apparatus of claim 2, wherein the manifold comprises one or more internal walls defining bifurcated second channels between the evaporator and the condenser members, the bifurcated second channels extending between different respective parts of the second and/or the third wicks.

6. The apparatus of claim 2, wherein the manifold comprises a plurality of first mechanical interfaces and a plurality of evaporator members, wherein each evaporator member of the plurality of the evaporator members is attached to the manifold so as to seal respective ones of the plurality of the first mechanical interfaces, each evaporator member of the plurality of the evaporator members having a respective third wick, and wherein the one or more internal walls of the manifold define one or more second channels between each evaporator member of the plurality of the evaporator members and the condenser member.

7. The apparatus of claim 1, wherein the manifold is formed by additive manufacturing.

8. The apparatus of claim 1 further comprising a plurality of manifolds wherein a first manifold and a second manifold are mechanically connected to each other in a three-dimensional structure, wherein a first evaporator member is mounted on the first manifold in such a way as to seal, respectively, a first mechanical interface or second mechanical interface of the second manifold.

9. The apparatus of claim 1, wherein the evaporator member is associated with an electrical or electronic component.

10. The apparatus of claim 9, wherein the electrical or electronic component is supported by at least part of the manifold.

11. A method comprising:
forming a manifold having a first mechanical interface, a second mechanical interface remote from the first mechanical interface and one or more internal walls defining at least a first channel and a second channel within the manifold between the first and second mechanical interfaces;
attaching an evaporator member to the manifold and configured to seal the first mechanical interface; and
attaching a condenser member to the manifold and configured to seal the second mechanical interface;
wherein the manifold, the evaporator member, and the condenser member provide a contained heat transfer system configured to allow a working fluid to move between the condenser member and the evaporator member;
wherein the manifold comprises a thermally-insulative material connecting the evaporator member and the condenser member.

12. The method of claim 11 further comprising: providing a first wick material in the first channel of the manifold, the evaporator and condenser members having respective second and third wicks coupled thereto, to provide a contained heat transfer system in which the first wick is located between the second and third wicks to provide a joined wick structure for moving working fluid between the interfaces, via the first wick, by capillary action.

13. The method of claim 11 wherein the manifold is formed by an additive manufacturing process.

14. The method of claim 11 further comprising: mounting one or more electrical or electronic components to the evaporator member.

15. The method of claim 14 further comprising: supporting the one or more electrical or electronic components by at least part of the manifold.

* * * * *